(12) United States Patent
Pepka et al.

(10) Patent No.: US 9,817,078 B2
(45) Date of Patent: Nov. 14, 2017

(54) METHODS AND APPARATUS FOR MAGNETIC SENSOR HAVING INTEGRATED COIL

(75) Inventors: Gary T. Pepka, Pembroke, NH (US); William P. Taylor, Amherst, NH (US)

(73) Assignee: ALLEGRO MICROSYSTEMS LLC, Worcester, MA (US)

( * ) Notice: Subject to any disclaimer, the term of this patent is extended or adjusted under 35 U.S.C. 154(b) by 0 days.

(21) Appl. No.: 13/468,478

(22) Filed: May 10, 2012

(65) Prior Publication Data
US 2013/0300406 A1    Nov. 14, 2013

(51) Int. Cl.
G01R 33/00    (2006.01)
G01R 33/09    (2006.01)

(52) U.S. Cl.
CPC ..... *G01R 33/0017* (2013.01); *G01R 33/0035* (2013.01); *G01R 33/09* (2013.01)

(58) Field of Classification Search
CPC ............................ G01R 33/093; G01R 33/0017
USPC ........ 324/167, 173, 179, 244, 258, 259, 263
See application file for complete search history.

(56) References Cited

U.S. PATENT DOCUMENTS

| | | |
|---|---|---|
| 3,132,337 A | 5/1964 | Martin |
| 3,195,043 A | 7/1965 | Burig et al. |
| 3,281,628 A | 10/1966 | Bauer et al. |
| 3,607,528 A | 9/1971 | Gassaway |
| 3,611,138 A | 10/1971 | Winebrener |
| 3,661,061 A | 5/1972 | Tokarz |
| 3,728,786 A | 4/1973 | Lucas et al. |
| 4,048,670 A | 9/1977 | Eysermans |
| 4,188,605 A | 2/1980 | Stout |
| 4,204,317 A | 5/1980 | Winn |
| 4,236,832 A | 12/1980 | Komatsu et al. |
| 4,283,643 A | 8/1981 | Levin |
| 4,315,523 A | 2/1982 | Mahawili et al. |
| 4,438,347 A | 3/1984 | Gehring |
| 4,573,258 A | 3/1986 | Io et al. |
| 4,614,111 A | 9/1986 | Wolff |
| 4,649,796 A | 3/1987 | Schmidt |
| 4,670,715 A | 6/1987 | Fuzzell |
| 4,719,419 A | 1/1988 | Dawley |
| 4,733,455 A | 3/1988 | Nakamura et al. |
| 4,745,363 A | 5/1988 | Carr et al. |
| 4,746,859 A | 5/1988 | Malik |

(Continued)

FOREIGN PATENT DOCUMENTS

| | | |
|---|---|---|
| CH | 683 469 A5 | 3/1994 |
| DE | 25 18 054 | 11/1976 |

(Continued)

OTHER PUBLICATIONS

Amendment under PCT Article 19 filed on Oct. 5, 2010 in PCT/US2010/024256, 18 pages.

(Continued)

*Primary Examiner* — Son Le
*Assistant Examiner* — Dustin Dickinson
(74) *Attorney, Agent, or Firm* — Daly, Crowley, Mofford & Durkee, LLP (57) ABSTRACT

Methods and apparatus for a magnetic field sensor including a die, a coil proximate the die to generate a magnetic field, and a magnetic field sensing element having to detect changes in the magnetic field generated by the coil in response to a ferromagnetic target.

25 Claims, 6 Drawing Sheets

(56) References Cited

U.S. PATENT DOCUMENTS

| | | | |
|---|---|---|---|
| 4,752,733 A | 6/1988 | Petr et al. | |
| 4,758,943 A | 7/1988 | Aström et al. | |
| 4,760,285 A | 7/1988 | Nelson | |
| 4,764,767 A | 8/1988 | Ichikawa et al. | |
| 4,769,344 A | 9/1988 | Sakai et al. | |
| 4,772,929 A | 9/1988 | Manchester | |
| 4,789,826 A | 12/1988 | Willett | |
| 4,796,354 A | 1/1989 | Yokoyama et al. | |
| 4,823,075 A | 4/1989 | Alley | |
| 4,833,406 A | 5/1989 | Foster | |
| 4,893,027 A | 1/1990 | Kammerer et al. | |
| 4,908,685 A | 3/1990 | Shibasaki et al. | |
| 4,910,861 A | 3/1990 | Dohogne | |
| 4,935,698 A | 6/1990 | Kawaji et al. | |
| 4,944,028 A * | 7/1990 | Iijima | G01D 5/145 324/207.12 |
| 4,954,777 A | 9/1990 | Klopfer et al. | |
| 4,970,411 A | 11/1990 | Halg et al. | |
| 4,983,916 A | 1/1991 | Iijima et al. | |
| 5,012,322 A | 4/1991 | Guillotte | |
| 5,021,493 A | 6/1991 | Sandstrom | |
| 5,028,868 A | 7/1991 | Murata et al. | |
| 5,045,920 A | 9/1991 | Vig et al. | |
| 5,078,944 A | 1/1992 | Yoshino | |
| 5,084,289 A | 1/1992 | Shin et al. | |
| 5,121,289 A | 6/1992 | Gagliardi | |
| 5,137,677 A | 8/1992 | Murata | |
| 5,139,973 A | 8/1992 | Nagy et al. | |
| 5,167,896 A | 12/1992 | Hirota et al. | |
| 5,185,919 A | 2/1993 | Hickey | |
| 5,196,794 A | 3/1993 | Murata | |
| 5,200,698 A | 4/1993 | Thibaud | |
| 5,210,493 A | 5/1993 | Schroeder et al. | |
| 5,216,405 A | 6/1993 | Schroeder et al. | |
| 5,244,834 A | 9/1993 | Suzuki et al. | |
| 5,247,202 A | 9/1993 | Popovic et al. | |
| 5,247,278 A | 9/1993 | Pant et al. | |
| 5,250,925 A | 10/1993 | Shinkle | |
| 5,286,426 A | 2/1994 | Rano, Jr. et al. | |
| 5,289,344 A | 2/1994 | Gagnon et al. | |
| 5,315,245 A | 5/1994 | Schroeder et al. | |
| 5,329,416 A | 7/1994 | Ushiyama et al. | |
| 5,332,956 A | 7/1994 | Oh | |
| 5,332,965 A | 7/1994 | Wolf et al. | |
| 5,399,968 A | 3/1995 | Sheppard et al. | |
| 5,412,255 A | 5/1995 | Wallrafen | |
| 5,414,355 A | 5/1995 | Davidson et al. | |
| 5,424,558 A | 6/1995 | Borden et al. | |
| 5,432,444 A * | 7/1995 | Yasohama | G01N 27/82 324/207.17 |
| 5,434,105 A | 7/1995 | Liou | |
| 5,453,727 A | 9/1995 | Shibasaki et al. | |
| 5,469,058 A | 11/1995 | Dunnam | |
| 5,479,695 A | 1/1996 | Grader et al. | |
| 5,486,759 A | 1/1996 | Seiler et al. | |
| 5,488,294 A | 1/1996 | Liddell et al. | |
| 5,491,633 A | 2/1996 | Henry et al. | |
| 5,497,081 A | 3/1996 | Wolf et al. | |
| 5,500,589 A | 3/1996 | Sumcad | |
| 5,500,994 A | 3/1996 | Itaya | |
| 5,508,611 A | 4/1996 | Schroeder et al. | |
| 5,521,501 A | 5/1996 | Dettmann et al. | |
| 5,551,146 A | 9/1996 | Kawabata et al. | |
| 5,581,170 A | 12/1996 | Mammano et al. | |
| 5,581,179 A | 12/1996 | Engel et al. | |
| 5,621,319 A | 4/1997 | Bilotti et al. | |
| 5,627,315 A | 5/1997 | Figi et al. | |
| 5,631,557 A | 5/1997 | Davidson | |
| 5,640,090 A | 6/1997 | Furuya et al. | |
| 5,691,637 A | 11/1997 | Oswald et al. | |
| 5,696,790 A | 12/1997 | Graham et al. | |
| 5,712,562 A | 1/1998 | Berg | |
| 5,714,102 A | 2/1998 | Highum et al. | |
| 5,719,496 A | 2/1998 | Wolf | |
| 5,729,128 A | 3/1998 | Bunyer et al. | |
| 5,757,181 A | 5/1998 | Wolf et al. | |
| 5,781,005 A | 7/1998 | Vig et al. | |
| 5,789,658 A | 8/1998 | Henn et al. | |
| 5,789,915 A | 8/1998 | Ingraham | |
| 5,796,249 A | 8/1998 | Andräet et al. | |
| 5,818,222 A | 10/1998 | Ramsden | |
| 5,818,223 A | 10/1998 | Wolf | |
| 5,839,185 A | 11/1998 | Smith et al. | |
| 5,841,276 A | 11/1998 | Makino et al. | |
| 5,859,387 A | 1/1999 | Gagnon | |
| 5,883,567 A | 3/1999 | Mullins, Jr. | |
| 5,886,070 A | 3/1999 | Honkura et al. | |
| 5,912,556 A | 6/1999 | Frazee et al. | |
| 5,963,028 A | 10/1999 | Engel et al. | |
| 6,011,770 A | 1/2000 | Tan | |
| 6,016,055 A | 1/2000 | Jager et al. | |
| 6,043,644 A | 3/2000 | de Coulon et al. | |
| 6,136,250 A | 10/2000 | Brown | |
| 6,175,233 B1 | 1/2001 | McCurley et al. | |
| 6,180,041 B1 | 1/2001 | Takizawa | |
| 6,184,679 B1 | 2/2001 | Popovic et al. | |
| 6,198,373 B1 | 3/2001 | Ogawa et al. | |
| 6,242,604 B1 | 6/2001 | Hudlicky et al. | |
| 6,242,904 B1 | 6/2001 | Shirai et al. | |
| 6,242,905 B1 | 6/2001 | Draxelmayr | |
| 6,265,865 B1 | 7/2001 | Engel et al. | |
| 6,278,269 B1 | 8/2001 | Vig et al. | |
| 6,297,627 B1 | 10/2001 | Towne et al. | |
| 6,339,322 B1 | 1/2002 | Loreck et al. | |
| 6,351,506 B1 | 2/2002 | Lewicki | |
| 6,356,068 B1 | 3/2002 | Steiner et al. | |
| 6,392,478 B1 | 5/2002 | Mulder et al. | |
| 6,424,018 B1 | 7/2002 | Ohtsuka | |
| 6,429,640 B1 * | 8/2002 | Daughton et al. | 324/117 R |
| 6,436,748 B1 | 8/2002 | Forbes et al. | |
| 6,437,558 B2 | 8/2002 | Li et al. | |
| 6,462,536 B1 | 10/2002 | Mednikov et al. | |
| 6,492,804 B2 | 12/2002 | Tsuge et al. | |
| 6,501,270 B1 | 12/2002 | Opie | |
| 6,504,363 B1 | 1/2003 | Dogaru et al. | |
| 6,525,531 B2 | 2/2003 | Forrest et al. | |
| 6,542,847 B1 | 4/2003 | Lohberg et al. | |
| 6,545,332 B2 | 4/2003 | Huang | |
| 6,545,457 B2 | 4/2003 | Goto et al. | |
| 6,545,462 B2 | 4/2003 | Schott et al. | |
| 6,566,862 B1 | 5/2003 | Goto et al. | |
| 6,566,872 B1 | 5/2003 | Sugitani | |
| 6,640,451 B1 | 11/2003 | Vinarcik | |
| 6,653,968 B1 | 11/2003 | Schneider | |
| 6,687,644 B1 | 2/2004 | Zinke et al. | |
| 6,692,676 B1 | 2/2004 | Vig et al. | |
| 6,707,298 B2 * | 3/2004 | Suzuki et al. | 324/252 |
| 6,759,843 B2 * | 7/2004 | Furlong | G01D 5/145 324/207.2 |
| 6,770,163 B1 | 8/2004 | Kuah et al. | |
| 6,781,233 B2 | 8/2004 | Zverev et al. | |
| 6,781,359 B2 | 8/2004 | Stauth et al. | |
| 6,798,193 B2 | 9/2004 | Zimmerman et al. | |
| 6,815,944 B2 | 11/2004 | Vig et al. | |
| 6,822,443 B1 | 11/2004 | Dogaru | |
| 6,853,178 B2 | 2/2005 | Hayat-Dawoodi | |
| 6,896,407 B2 | 5/2005 | Nomiyama et al. | |
| 6,902,951 B2 | 6/2005 | Goller et al. | |
| 6,917,321 B1 | 7/2005 | Haurie et al. | |
| 7,026,808 B2 | 4/2006 | Vig et al. | |
| 7,031,170 B2 | 4/2006 | Daeche et al. | |
| 7,038,448 B2 | 5/2006 | Schott et al. | |
| 7,049,924 B2 | 5/2006 | Hayashi et al. | |
| 7,126,327 B1 | 10/2006 | Busch | |
| 7,132,825 B2 * | 11/2006 | Martin | 324/207.17 |
| 7,190,784 B2 | 3/2007 | Li | |
| 7,193,412 B2 | 3/2007 | Freeman | |
| 7,199,579 B2 | 4/2007 | Scheller et al. | |
| 7,259,545 B2 | 8/2007 | Stauth et al. | |
| 7,265,531 B2 | 9/2007 | Stauth et al. | |
| 7,269,992 B2 | 9/2007 | Lamb et al. | |
| 7,292,095 B2 | 11/2007 | Burt et al. | |
| 7,295,000 B2 | 11/2007 | Werth | |
| 7,319,319 B2 | 1/2008 | Jones et al. | |

(56) References Cited

U.S. PATENT DOCUMENTS

| | | |
|---|---|---|
| 7,323,780 B2 | 1/2008 | Daubenspeck et al. |
| 7,323,870 B2 | 1/2008 | Tatschl et al. |
| 7,325,175 B2 | 1/2008 | Momtaz |
| 7,345,468 B2 | 3/2008 | Okada et al. |
| 7,361,531 B2 | 4/2008 | Sharma et al. |
| 7,362,094 B2 | 4/2008 | Voisine et al. |
| 7,365,530 B2 | 4/2008 | Bailey et al. |
| 7,385,394 B2 | 6/2008 | Auburger et al. |
| 7,425,821 B2 | 9/2008 | Monreal et al. |
| 7,474,093 B2 | 1/2009 | Ausserlechner |
| 7,476,953 B2 | 1/2009 | Taylor et al. |
| 7,518,354 B2 | 4/2009 | Stauth et al. |
| 7,592,801 B2 | 9/2009 | Bailey et al. |
| 7,598,601 B2 | 10/2009 | Taylor et al. |
| 7,605,647 B1 | 10/2009 | Romero et al. |
| 7,635,993 B2 | 12/2009 | Boeve |
| 7,694,200 B2 | 4/2010 | Forrest et al. |
| 7,701,208 B2 | 4/2010 | Nishikawa |
| 7,729,675 B2 | 6/2010 | Krone |
| 7,746,056 B2 | 6/2010 | Stauth et al. |
| 7,746,065 B2 | 6/2010 | Pastre et al. |
| 7,764,118 B2 | 7/2010 | Kusuda et al. |
| 7,768,083 B2 | 8/2010 | Doogue et al. |
| 7,769,110 B2 | 8/2010 | Momtaz |
| 7,800,389 B2 | 9/2010 | Friedrich et al. |
| 7,808,074 B2 | 10/2010 | Knittl |
| 7,816,772 B2 | 10/2010 | Engel et al. |
| 7,816,905 B2 | 10/2010 | Doogue et al. |
| 7,839,141 B2 | 11/2010 | Werth et al. |
| 7,923,996 B2 | 4/2011 | Doogue et al. |
| 7,936,144 B2 | 5/2011 | Vig et al. |
| 7,961,823 B2 | 6/2011 | Kolze et al. |
| 7,990,209 B2 | 8/2011 | Romero |
| 8,030,918 B2 | 10/2011 | Doogue et al. |
| 8,058,870 B2 | 11/2011 | Sterling |
| 8,063,631 B2 | 11/2011 | Fermon et al. |
| 8,063,634 B2 | 11/2011 | Sauber et al. |
| 8,128,549 B2 | 3/2012 | Testani et al. |
| 8,134,358 B2 | 3/2012 | Charlier et al. |
| 8,143,169 B2 | 3/2012 | Engel et al. |
| 8,274,279 B2 | 9/2012 | Gies |
| 2001/0002791 A1 | 6/2001 | Tsuge et al. |
| 2001/0009367 A1 | 7/2001 | Seitzer et al. |
| 2002/0027488 A1 | 3/2002 | Hayat-Dawoodi et al. |
| 2002/0084923 A1 | 7/2002 | Li |
| 2003/0001563 A1 | 1/2003 | Turner |
| 2003/0038675 A1 | 2/2003 | Gailus et al. |
| 2003/0062891 A1 | 4/2003 | Slates |
| 2003/0102909 A1 | 6/2003 | Motz |
| 2003/0222642 A1 | 12/2003 | Butzmann |
| 2003/0227286 A1 | 12/2003 | Dunisch et al. |
| 2004/0032251 A1 | 2/2004 | Zimmerman et al. |
| 2004/0046248 A1 | 3/2004 | Waelti et al. |
| 2004/0062362 A1 | 4/2004 | Matsuya |
| 2004/0080314 A1 | 4/2004 | Tsujii et al. |
| 2004/0135220 A1 | 7/2004 | Goto |
| 2004/0155644 A1 | 8/2004 | Stauth et al. |
| 2004/0184196 A1 | 9/2004 | Jayasekara |
| 2004/0196045 A1 | 10/2004 | Larsen |
| 2005/0017709 A1 | 1/2005 | Stolfus et al. |
| 2005/0122095 A1 | 6/2005 | Dooley |
| 2005/0122099 A1 | 6/2005 | Imamoto et al. |
| 2005/0167790 A1 | 8/2005 | Khor et al. |
| 2005/0179429 A1 | 8/2005 | Lohberg |
| 2005/0225318 A1 | 10/2005 | Bailey et al. |
| 2005/0280411 A1 | 12/2005 | Bicking |
| 2006/0033487 A1 | 2/2006 | Nagano et al. |
| 2006/0038559 A1 | 2/2006 | Lamb et al. |
| 2006/0068237 A1 | 3/2006 | Murphy |
| 2006/0097717 A1 | 5/2006 | Tokuhara et al. |
| 2006/0125473 A1 | 6/2006 | Frachon et al. |
| 2006/0175674 A1 | 8/2006 | Taylor |
| 2006/0181263 A1 | 8/2006 | Doogue et al. |
| 2006/0202692 A1 | 9/2006 | Tatschl et al. |
| 2006/0261801 A1 | 11/2006 | Busch |
| 2007/0110199 A1 | 5/2007 | Momtaz et al. |
| 2007/0170533 A1* | 7/2007 | Doogue ............... B82Y 25/00 257/422 |
| 2007/0247141 A1* | 10/2007 | Pastre ............... G01R 33/0035 324/202 |
| 2007/0285089 A1 | 12/2007 | Ibuki et al. |
| 2008/0013298 A1 | 1/2008 | Ararao et al. |
| 2008/0094055 A1 | 4/2008 | Monreal et al. |
| 2008/0137784 A1 | 6/2008 | Krone |
| 2008/0143329 A1 | 6/2008 | Ishihara |
| 2008/0237818 A1 | 10/2008 | Engel et al. |
| 2008/0238410 A1 | 10/2008 | Charlier et al. |
| 2008/0270067 A1* | 10/2008 | Eriksen et al. ............... 702/150 |
| 2009/0001964 A1 | 1/2009 | Strzalkowski |
| 2009/0001972 A1 | 1/2009 | Fernandez et al. |
| 2009/0058404 A1 | 3/2009 | Kurumado |
| 2009/0085706 A1 | 4/2009 | Baarman et al. |
| 2009/0102467 A1 | 4/2009 | Snell et al. |
| 2009/0140725 A1 | 6/2009 | Ausserlechner |
| 2009/0152696 A1 | 6/2009 | Dimasacat et al. |
| 2009/0167298 A1 | 7/2009 | Kreutzbruck et al. |
| 2009/0168286 A1 | 7/2009 | Berkley et al. |
| 2009/0206831 A1 | 8/2009 | Fermon et al. |
| 2009/0212765 A1 | 8/2009 | Doogue et al. |
| 2009/0243601 A1 | 10/2009 | Feldtkeller |
| 2009/0251134 A1 | 10/2009 | Uenoyama |
| 2010/0026279 A1 | 2/2010 | Vig et al. |
| 2010/0026288 A1* | 2/2010 | Sauber ............... B82Y 25/00 324/252 |
| 2010/0033175 A1* | 2/2010 | Boeve et al. ............... 324/252 |
| 2010/0052667 A1* | 3/2010 | Kohama et al. ............... 324/239 |
| 2010/0141249 A1 | 6/2010 | Ararao et al. |
| 2010/0188078 A1* | 7/2010 | Foletto et al. ............... 324/251 |
| 2010/0201356 A1 | 8/2010 | Koller et al. |
| 2010/0211347 A1 | 8/2010 | Friedrich et al. |
| 2010/0237450 A1 | 9/2010 | Doogue et al. |
| 2010/0276769 A1 | 11/2010 | Theuss et al. |
| 2010/0295140 A1 | 11/2010 | Theuss et al. |
| 2010/0330708 A1 | 12/2010 | Engel et al. |
| 2011/0018533 A1 | 1/2011 | Cesaretti et al. |
| 2011/0031960 A1 | 2/2011 | Hohe et al. |
| 2011/0048102 A1 | 3/2011 | Fernandez et al. |
| 2011/0074405 A1 | 3/2011 | Doogue et al. |
| 2011/0285384 A1* | 11/2011 | Nomura ............... G01R 15/205 324/117 R |
| 2011/0298448 A1 | 12/2011 | Foletto et al. |
| 2012/0013333 A1 | 1/2012 | Ararao et al. |
| 2012/0019236 A1 | 1/2012 | Tiernan et al. |
| 2012/0062215 A1 | 3/2012 | Ide et al. |
| 2012/0086090 A1 | 4/2012 | Sharma et al. |
| 2012/0091994 A1 | 4/2012 | Han et al. |
| 2012/0161759 A1 | 6/2012 | Pozzati et al. |
| 2012/0274314 A1 | 11/2012 | Cesaretti et al. |
| 2012/0293164 A1 | 11/2012 | Liou et al. |
| 2012/0293167 A1 | 11/2012 | Kitanaka et al. |
| 2013/0138372 A1 | 5/2013 | Ausserlechner |
| 2013/0214777 A1 | 8/2013 | Itoi |
| 2013/0241543 A1* | 9/2013 | Stenson et al. ............... 324/252 |
| 2013/0300401 A1 | 11/2013 | Krapf et al. |
| 2014/0266181 A1 | 9/2014 | Milano et al. |

FOREIGN PATENT DOCUMENTS

| | | |
|---|---|---|
| DE | 40 31 560 | 4/1992 |
| DE | 41 41 386 A1 | 6/1993 |
| DE | 195 39 458 A1 | 4/1997 |
| DE | 196 34 715 A1 | 3/1998 |
| DE | 196 50 935 A1 | 6/1998 |
| DE | 198 38 433 | 3/1999 |
| DE | 199 61 504 A1 | 6/2001 |
| DE | 102 10 184 | 9/2003 |
| DE | 103 14 602 A1 | 10/2004 |
| DE | 10 2006 037 226 A1 | 2/2008 |
| DE | 10 2007 018 238 A1 | 10/2008 |
| DE | 10 2007 041 230 B3 | 4/2009 |
| DE | 10 2007 044485 A1 | 4/2009 |
| DE | 10 2010 016 584 | 11/2010 |
| DE | 10 2010 028390 A1 | 11/2011 |

(56) References Cited

FOREIGN PATENT DOCUMENTS

| | | |
|---|---|---|
| DE | 10 2011 102483 | 11/2012 |
| DE | 10 2011 102483 A1 | 11/2012 |
| EP | 0289414 A2 | 11/1988 |
| EP | 0289414 A3 | 11/1988 |
| EP | 0357013 A2 | 3/1990 |
| EP | 0357013 A3 | 3/1990 |
| EP | 0 361 456 A2 | 4/1990 |
| EP | 0 680 103 A1 | 11/1995 |
| EP | 8 896 180 A2 | 2/1999 |
| EP | 0 944 888 B1 | 10/2001 |
| EP | 1306687 A2 | 5/2003 |
| EP | 1 403 648 A1 | 3/2004 |
| EP | 1 443 332 A1 | 8/2004 |
| EP | 1 580 560 A1 | 9/2005 |
| EP | 1637898 A1 | 3/2006 |
| EP | 1 662 353 A1 | 5/2006 |
| EP | 1679524 A1 | 7/2006 |
| EP | 1 783 507 A1 | 5/2007 |
| EP | 1850143 A1 | 10/2007 |
| EP | 2 063 229 | 5/2009 |
| EP | 2 063 229 A1 | 5/2009 |
| EP | 2 108 966 A1 | 10/2009 |
| FR | 2 748 105 | 10/1997 |
| FR | 2 909 756 | 6/2008 |
| GB | 2135060 A | 8/1984 |
| GB | 2276727 A | 10/1994 |
| GB | 2 481 482 | 12/2011 |
| JP | 363 084176 A | 4/1988 |
| JP | 63-263782 | 10/1988 |
| JP | 63-300911 | 12/1988 |
| JP | H2-116753 | 5/1990 |
| JP | 02-149013 | 6/1990 |
| JP | H03-29817 | 2/1991 |
| JP | H04-095817 | 3/1992 |
| JP | 04-152688 | 5/1992 |
| JP | H06-273437 | 9/1994 |
| JP | 07-012582 | 1/1995 |
| JP | 08097486 | 4/1996 |
| JP | H08-511348 A | 11/1996 |
| JP | 9-166612 | 6/1997 |
| JP | 10-332725 | 12/1998 |
| JP | 11-064363 | 3/1999 |
| JP | 11074142 | 3/1999 |
| JP | 2000-183241 A | 6/2000 |
| JP | 2001-043475 | 2/2001 |
| JP | 2001-141738 A | 5/2001 |
| JP | 2001-1659951 | 6/2001 |
| JP | 2002-117500 | 4/2002 |
| JP | 2002-357920 | 12/2002 |
| JP | 2003-177171 | 6/2003 |
| JP | 2003-202365 A | 7/2003 |
| JP | 2004-356338 | 12/2004 |
| JP | 2006-3116 A | 1/2006 |
| JP | 2006-275764 | 10/2006 |
| JP | 4093381 | 3/2008 |
| JP | 2008-180550 | 8/2008 |
| JP | 2009-222524 | 10/2009 |
| JP | 4880874 | 12/2011 |
| JP | 2012-501446 A | 1/2012 |
| WO | WO 88/09026 | 11/1988 |
| WO | WO 94/29672 A1 | 12/1994 |
| WO | WO 9602849 A1 | 2/1996 |
| WO | WO 99/49322 | 9/1999 |
| WO | WO 01/74139 A2 | 10/2001 |
| WO | WO 01/74139 A3 | 10/2001 |
| WO | WO 03/069358 A2 | 8/2003 |
| WO | WO 03/069358 A3 | 8/2003 |
| WO | WO 03/107018 A1 | 12/2003 |
| WO | WO 2004/027436 | 4/2004 |
| WO | WO 2004/072672 A1 | 8/2004 |
| WO | WO 2005/013363 A2 | 2/2005 |
| WO | WO 2005/013363 A3 | 2/2005 |
| WO | WO 2006/056829 | 6/2006 |
| WO | WO 2006/083479 | 8/2006 |
| WO | WO2007/095971 A1 | 8/2007 |
| WO | WO 2007/138508 A1 | 12/2007 |
| WO | WO 2008/008140 A2 | 1/2008 |
| WO | WO 2008/008140 A3 | 1/2008 |
| WO | WO 2008/048379 A1 | 4/2008 |
| WO | WO 2008/121443 A1 | 10/2008 |
| WO | WO 2008/145662 A1 | 12/2008 |
| WO | WO 2009/108422 A2 | 9/2009 |
| WO | WO 2009/108422 A3 | 9/2009 |
| WO | WO 2010/014309 A1 | 2/2010 |
| WO | WO 2010/027658 A2 | 3/2010 |
| WO | WO 2010/065315 | 6/2010 |
| WO | WO 2010/096367 A1 | 8/2010 |
| WO | WO 2011/011479 | 1/2011 |
| WO | WO 2012/148646 | 11/2012 |
| WO | WO 2013/141981 | 9/2013 |
| WO | WO 2013/169455 | 11/2013 |
| WO | WO2015/058733 A1 | 4/2015 |

OTHER PUBLICATIONS

Doogue et al.; Magnetic Field Sensor with Automatic Sensitivity Adjustment; U.S. Appl. No. 12/959,672, filed Dec. 3, 2010; 55 pages.

Notice of Allowance dated Jul. 19, 2011; from U.S. Appl. No. 12/959,672; 7 pages.

Office Action dated Aug. 29, 2012 from Chinese Application No. 200980106535.4, 8 pages.

Office Action/Restriction Requirement dated May 14, 2010 for U.S. Appl. No. 12/037,393 6 pages.

Request for Continued Examination; from U.S. Appl. No. 12/959,672; 2 pages.

Response to Office Action/Restriction Requirement dated May 14, 2010 for U.S. Appl. No. 12/037,393, 6 pages.

Response to Office Action dated Jun. 30, 2010 for U.S. Appl. No. 12/037,393; 35 pages.

U.S. Notice of Allowance dated Jun. 27, 2011 for U.S. Appl. No. 12/959,672; 8 pages.

U.S. Notice of Allowance dated Nov. 3, 2010 for U.S. Appl. No. 12/037,393, 7 pages.

U.S. Office Action dated Jun. 30, 2010 for U.S. Appl. No. 12/037,393; 21 pages.

Smith et al.; "Low Magnetic Field Sensing with GMR Sensors;" Sensor Magazine; Part 1; Sep. 1999; http://archives.sensorsmag.com/articles/0999/76mail.shtml; pp. 1-8.

Smith et al.; "Low Magnetic Field Sensing with GMR Sensors;" Sensor Magazine; Part 2; Oct. 1999; http://archives.sensorsmag.com/articles/1099/84/mail.shtml; pp. 1-11.

Notice of Allowance dated Feb. 11, 2011 for U.S. Appl. No. 12/037,393, 8 pages.

Notification of Transmittal of the International Search Report and the Written Opinion of the International Searching Authority, or the Declaration; PCT/US2012/032315, date of mailing Jun. 22, 2012, 18 pages.

Office Action dated Sep. 11, 2012 from U.S. Appl. No. 12/840,324, 30 pages.

Allegro "Two-Wire True Zero Speed Miniature Differential Peak-Detecting Gear Tooth Sensor," ATS645LSH; 2004; Allegro MicroSystems, Inc., Worcester, MA 01615; pp. 1-14.

Allegro Microsystems, Inc., "Gear-Tooth Sensor for Automotive Applications," Aug. 3, 2001.

Allegro MicroSystems, Inc., Hall-Effect IC Applications Guide, http://www.allegromicro.com/en/Products/Design/an/an27701.pdf, Copyright 1987, 1997, pp. 1-36.

Allegro "True Zero-Speed Low-Jitter High Accuracy Gear Tooth Sensor," ATS625LSG; 2005; Allegro MicroSystems, Inc. Worcester, MA 01615; pp. 1-21.

Bowers et al., "Microfabrication and Process Integration of Powder-Based Permanent Magnets", Interdisciplinary Microsystems Group, Dept. Electrical and Computer Engineering, University of Florida, USA; Technologies for Future Micro-Nano Manufacturing Workshop, Napa, California, Aug. 8-10, 2011, pp. 162-165.

CN Office Action (w/English translation); dated Sep. 10, 2010; for CN Pat. App. No. CN 2008800088956; 14 pages.

(56) References Cited

OTHER PUBLICATIONS

Dwyer, "Back-Biased Packaging Advances (SE, SG & SH versus SA & SB);" http://www.allegromicro.com/en/Products/Design/packaging_advances/index.asp, Copyright 2008, pp. 1-5.
Honeywell International, Inc., "Hall Effect Sensing and Application," Micro Switch Sensing and Control, Chapter 3, http://content.honeywell.com/sensing/prodinfo/solidstate/technical/hallbook.pdf, date unavailable but believed to be before Jan. 2008, pp. 9-18.
Infineon Product Brief, TLE 4941plusC, Differential Hall IC for Wheel Speed Sensing, Oct. 2010, www.infineon.com/sensors, 2 pages.
Johnson et al., "Hybrid Hall Effect Device," Appl. Phys. Lett., vol. 71, No. 7, Aug. 1997, pp. 974-976.
Lagorce et al.; "Magnetic and Mechanical Properties of Micromachined Strontium Ferrite/Polyimide Composites;" Journal of Microelectromechanical Systems; vol. 6, No. 4; Dec. 1997; pp. 307-312.
Lequesne et al.; "High-Accuracy Magnetic Position Encoder Concept;" IEEE Transactions on Industry Applications; vol. 35, No. 3; May/Jun. 1999; pp. 568-576.
Melexis Microelectronic Systems, Hall Applications Guide, Section 3—Applications, 1997 (48 pages).
Oniku et al., "High-Energy-Density Permanent Micromagnets Formed From Heterogeneous Magnetic Powder Mixtures", Interdisciplinary Microsystems Group, Dept. of Electrical and Computer Engineering, University of Florida, Gainesville, FL 32611, USA; Preprint of MEMS 2012 Conf. Paper, 4 pages.
Park et al.; "Ferrite-Based Integrated Planar Inductors and Transformers Fabricated at Low Temperature;" IEEE Transactions on Magnetics; vol. 33, No. 5; Sep. 1997; pp. 3322-3324.
PCT International Preliminary Report on Patentability and Written Opinion of the ISA; dated Jun. 7, 2011; for PCT Pat. App. No. PCT/US2009/065044; 7 pages.
PCT International Preliminary Report on Patentability for PCT/US2008/053551; dated Oct. 8, 2009; 7 pages.
PCT Search Report & Written Opinion for PCT/US2006/000363 dated May 11, 2006.
PCT Search Report and Written Opinion for PCT/US2009/065044 dated Jan. 7, 2010.
PCT Search Report and Written Opinion of the ISA for PCT/US2008/053551; dated Jul. 15, 2008; 11 pages.
U.S. Appl. No. 13/424,618, filed Mar. 20, 2012, 59 pages.
U.S. Appl. No. 13/350,970, filed Jan. 16, 2012, 27 pages.
Ausserlechner; "Limits of Offset Cancellation by the Principle of Spinning Current Hall Probe;" Proceedings of IEEE Sensors; Oct. 2004; pp. 1117-1120.
Cesaretti et al.; "Circuits and Methods for Self-Calibrating or Self-Testing a Magnetic Field Sensor;" U.S. Appl. No. 13/095,371, filed Apr. 27, 2011; 62 pages.
Cessaretti et al; "Circuits and Methods Using Adjustable Feedback for Self-Calibrating or Self-Testing a Magnetic Field Sensor with an Adjustable Time Constraint;" U.S. Appl. No. 13/398,127; 85 pages.
Cessaretti et al; "Circuits and Methods for Generating a Diagnostic Mode of Operation in a Magnetic Field Sensor;" U.S. Appl. No. 12/840,324; 80 pages.
EP Official Communication; dated Feb. 23, 2012; for EP. Pat. App. No. 10739429.8; 2 pages.
Office Action dated Jul. 6, 2012; for U.S. Appl. No. 12/706,318, filed Feb. 16, 2010; 24 pages.
PCT International Preliminary Report on Patentability and Written Opinion of the ISA for PCT Pat. App. No. PCT/US2010/024256; dated Sep. 1, 2011; 9 pages.
PCT International Preliminary Report on Patentability and Written Opinion of the ISA; dated Feb. 2, 2012; for PCT Pat. App. No. PCT/US2010/042694; 11 sheets.
PCT Search Report and Written Opinion of the ISA for PCT Pat. App. No. PCT/US2012/032315; dated Jun. 22, 2012; 16 pages.
PCT Search Report and Written Opinion of the ISA for PCT/US2010/042694 dated Sep. 27, 2010.

Response to EP Official Communication dated Feb. 23, 2012 for EP. Pat. App. No. 10739429.8; filed on Sep. 4, 2012, 21 pages.
Sargent; "Switched-capacitor IC controls feedback loop;" EDN; Design Ideas: Feb. 17, 2000; pp. 154 and 186.
Wu, et al.; "A Chopper Current-Feedback Instrumentation Amplifier with a 1mHz 1/f Noise Corner and an AC-Coupled Ripple-Reduction Loop;" IEEE International Solid State Circuits Conference; Feb. 10, 2009; pp. 322-324.
Ahn et al., "A New Toroidal-Meander Type Integrated Inductor With a Multilevel Meander Magnetic Core", IEEE Transactions on Magnetics, vol. 30, No. 1, Jan. 1994, pp. 73-79.
Ausserlechner et al.; "Compensation of the Piezo-Hall Effect in Integrated Hall Sensors on (100)-Si;" IEEE Sensors Journal, vol. 7, No. 11; Nov. 2007; ISBN: 1530-437X; pp. 1475-1482.
Ausserlechner et al.; "Drift of Magnetic Sensitivity of Small Hall Sensors Due to Moisture Absorbed by the IC-Package;" Proceedings of IEEE Sensors, 2004; vol. 1; Oct. 24, 2004; ISBN:0-7803-8692-2; pp. 455-458.
Ausserlechner; "The piezo-Hall effect in n-silicon for arbitrary crystal orientation;" Proceedings of IEEE Sensors; vol. 3; Oct. 24, 2004; ISBN: 0-7803-8692-2; pp. 1149-1152.
Bahreyni, et al.; "A Resonant Micromachined Magnetic Field Sensor;" IEEE Sensors Journal; vol. 7, No. 9, Sep. 2007; pp. 1326-1334.
Barrettino, et al.; "CMOS-Based Monolithic Controllers for Smart Sensors Comprising Micromembranes and Microcantilevers;" IEEE Transactions on Circuits and Systems~I Regular Papers vol. 54, No. 1; Jan. 2007; pp. 141-152.
Baschirotto et al.; "Development and Analysis of PCB Vector 2-D Magnetic Field Sensor System for Electronic Compass;" IEEE Sensors Journal vol. 6, No. 2; Apr. 2006; pp. 365-371.
Bilotti et al.; "Monolithic Magnetic Hall Sensor Using Dynamic Quadrature Offset Cancellation;" IEEE Journal of Solid-State Circuits; vol. 32, Issue 6; Jun. 1997; pp. 829-836.
Demierre, et al.; "Reference Magnetic Actuator for Self-Calibration of a Very Small Hall Sensor Array;" Sensors and Actuators A97-98; Apr. 2002; pp. 39-46.
Frick, et al.; "CMOS Microsystem for AC Current Measurement with Galvanic Isolation;" IEEE Sensors Journal; vol. 3, No. 6; Dec. 2003; pp. 752-760.
Halg; "Piezo-Hall Coefficients of n-Type Silicon;" Journal of Applied Physics; vol. 64, No. 1; Jul. 1, 1988; pp. 276-282.
Hosticka; "CMOS Sensor Systems;" Sensors and Actuators A66; Apr. 1998; pp. 335-341.
Kanda et al.; "The Piezo-Hall Effect in n-Silicon;" $22^{nd}$ International Conference on the Physics of Semiconductors; vol. 1, Jan. 1995; pp. 89-92.
Krammerer et al.; "A Hall effect sensors network insensitive to mechanical stress;" Proceedings of IEEE of IEEE Sensors; vol. 3, Oct. 2004; pp. 1071-1074.
Magnani et al.; "Mechanical Stress Measurement Electronics Based on Piezo-Resistive and Piezo-Hall Effects;" $9^{th}$ International Conference on Electronics, Circuits and Systems 2002; vol. 1; SBN: 0-7803-7596-3; Dec. 2002; pp. 363-366.
Manic et al.; "Short and Long-Term Stability Problems of Hall Plates in Plastic Packages;" IEEE $38^{th}$ Annual International Reliability Physics Symposium; Apr. 2000; pp. 225-230.
Manic; "Drift in Silicon Integrated Sensors and Circuits Due to the Thermo-Mechanical Stresses;" Lausanne, École Polytechnique Fédérale De Lausanne 2000; Part 1 of 2; 74 pages.
Manic; "Drift in Silicon Integrated Sensors and Circuits Due to the Thermo-Mechanical Stresses;" Lausanne, École Polytechnique Fédérale De Lausanne 2000; Part 2 of 2; 102 pages.
Motz et al.; "An Integrated Magnetic Sensor with Two Continuous-Time ΔΣ-Converters and Stress Compensation Capability;" IEEE International Solid-State Circuits Conference; Digest of Technical Papers; Feb. 6, 2006; ISBN: 1-4244-0079-1; pp. 1151-1160.
Motz, et al.; "A Chopped Hall Sensor with Small Jitter and Programmable "True Power-On" Function;" IEEE Journal of Solid-State Circuits; vol. 40, No. 7; Jul. 2005; pp. 1533-1540.
Motz, et al.; "An Integrated Hall Sensor Platform Design for Position, Angle and Current Sensing;" IEEE Sensors 2006; Exco, Daegu, Korea / Oct. 22-25, 2006; pp. 1008-1011.

(56) References Cited

OTHER PUBLICATIONS

Munter; "A Low-offset Spinning-current Hall Plate:" Sensors and Actuators A21-A23: 1990; pp. 742-746.
Munter: "Electronic Circuitry for a Smart Spinning-current Hall Plate with Low Offset;" Sensors and Actuators A; Jun. 1991;.pp. 747-751.
Office Action dated Feb. 2, 2011 from U.S. Appl. No. 12/959,672.
Partin et al.; "Temperature Stable Hall Effect Sensors;" IEEE Sensors Journal, vol. 6, No. 1; Feb. 2006; pp. 106-110.
Pastre, et al.; "A Hall Sensor Analog Front End for Current Measurement with Continuous Gain Calibration;" IEEE Sensors Journal; vol. 7, No. 5; May 2007; pp. 860-867.
Pastre, et al.; "A Hall Sensor-Based Current Measurement Microsystem With Continuous Gain Calibration;" Research in Microelectronics and Electronics, IEEE vol. 2; Jul. 25, 2005; ISBN: 0-7803-9345-7; pp. 95-98.
PCT International Preliminary Report on Patentability and Written Opinion mailed Sep. 10, 2010 for PCT/US2009/031776.
PCT Search Report and Written Opinion of the ISA for PCT/US2009/031776 dated Oct. 23, 2009.
PCT Search Report and Written Opinion of the ISA for PCT/US2010/024256 dated Aug. 11, 2010.
Popovic; "Sensor Microsystems;" Proc. $20^{th}$ International Conference on Microelectronics (MWIL 95); vol. 2, NIS, Serbia, 12-14; Sep. 1995; pp. 531-537.
Preliminary Amendment filed on Oct. 5, 2010 for U.S. Appl. No. 12/706,318.
Randhawa;"Monolithic Integrated Hall Devices in Silicon Circuits;" Microelectronics Journal; vol. 12, No. 6; Sep. 14-17, 1981; pp. 24-29.
Ruther et al.; "Integrated CMOS-Based Sensor Array for Mechanical Stress Mapping:" $5^{th}$ IEEE Conference on Sensors, Oct. 2007; pp. 1131-1134.
Ruther et al.; "Thermomagnetic Residual Offset in Integrated Hall Plates;" IEEE Sensors Journal; vol. 3, No. 6; Dec. 2003; pp. 693-699.
Schneider; "Temperature Calibration of CMOS Magnetic Vector Probe for Contactless Angle Measurement System," IEDM 1998 pp. 533-536.
Schott et al.; "Linearizing Integrated Hall Devices;" 1997 International Conference on Solid-State Sensors and Actuators, Jun. 16-19, 1997; pp. 393-396.
Schott, et al.; "CMOS Single-Chip Electronic Compass with Microcontroller;" IEEE Journal of Solid-State Circuits; vol. 42, No. 12; Dec. 2007; pp. 2923-2933.
Simon et al.; "Autocalibration of Silicon Hall Devices;" $8^{th}$ International Conference on Solid-State Sensors and Actuators; vol. 2; Jun. 25. 1995; pp. 237-240.
Steiner et al.; "Double-Hall Sensor with Self-Compensated Offset;" International Electron Devices Meeting; Dec. 7, 1997; ISBN: 0-7803-4100-7; pp. 911-914.
Steiner et al; Offset Reduction in Hall Devices by Continuous Spinning Current Method; Sensors and Actuators A66; 1998; pp. 167-172.
Stellrecht et al.; Characterization of Hygroscopic Swelling Behavior of Mold Compounds and Plastic Packages: IEEE Transactions on Components and Packaging Technologies; vol. 27, No. 3; Sep. 2004; pp. 499-506.
Tian et al.; "Multiple Sensors on Pulsed Eddy-Current Detection for 3-D Subsurface Crack Assessment;" IEEE Sensors Journal, vol. 5, No. 1; Feb. 2005; pp. 90-96.
Trontelj et al; "CMOS Integrated Magnetic Field Source Used as a Referenced in Magnetic Field Sensors on Common Substrate;" WEP 1-6; IMTC; May 1994; pp. 461-463.
Udo; "Limits of Offset Cancellation by the Principle of Spinning Current Hall Probe;" Proceedings of IEEE Sensors; Oct. 2004; pp. 1117-1120.
Zou et al.; "Three-Dimensional Die Surface Stress Measurements in Delaminated and Non-Delaminated Plastic Packages;" 48th Electronic Components and Technology Conference; May 25, 1998; pp. 1223-1234.
Allegro Microsystem, Inc. Data Sheet A1341; "High Precision, Highly Programmable Linear Hall Effect Sensor IC with EEPROM, Output Protocols SENT and PWM, and Advanced Output Linearization Capabilities;" May 17, 2010; 46 pages.
Allegro Microsystems, Inc. Data Sheet ATS601LSG; "Non-TPOS, Tooth Detecting Speed Sensor," Nov. 1, 2011; 9 pages.
CN Office Action dated May 3, 2012; for CN Pat. App. No. 200980189766.7 with English translation, 15 pages.
CN Response to Office Action filed on Oct. 18, 2012; for CN Pat. App. No. 200980189766.7; 10 pages.
Donovan et al.; "Systems and Methods for Synchronizing Sensor Data;" U.S. Appl. No. 12/968,353; filed on Dec. 15, 2010; 37 pages.
EP Communication from the Board of Appeal for EP 03 710 766.1; dated May 26, 2009; 16 pages.
EP Office Action dated Mar. 2, 2005 for EP 03 710 766.1; 8 pages.
EP Response to Office Action submitted May 2009 for EP 03 710 766.1; 19 pages.
EP Response to Written Opinion; dated Mar. 9, 2011; for EP Pat. App. No. 09789890.2; 11 pages.
EP Summons to Oral Proceedings dated Apr. 30, 2009 for EP 03 710 766.1; 4 pages.
Infineon Technologies; "Differential Two-Wire Hall Effect Sensor IC;" TLE4942 Preliminary Data Sheet; Jun. 2000; pp. 1-13.
International Preliminary Report on Patentability for PCT/US2009/048237 date of mailing Feb. 10, 2011, 9 pages.
JP Notice of Allowance dated Nov. 8, 2011; for JP Patent Application No. 2003-568426; 3 pages.
JP Notice of Rejection translation dated Nov. 16, 2010; for JP 2003-568426; 5 pages.
JP Office Action and Claims translation dated Aug. 29, 2011; for JP 2003-568426; 9 pages.
JP Official Action translation dated Apr. 7, 2008 for JP 2003-568426; 5 pages.
JP Official Action translation dated Dec. 12, 2008 for JP 2003-568426; 4 pages.
JP Amendment with translation of claims filed May 13, 2011; for JP 2003-568426; 17 pages.
JP Amendment translation filed Oct. 11, 2011 for JP Patent Application No. 2003-568426; 6 pages.
JP Response to Decision of Refusal and Demand of Appeal with translation filed Mar. 25, 2009 for JP 2003-668426; 8 pages.
JP Response to Official Action and translation dated Sep. 22, 2008 for JP 2003-568426; 14 pages.
Letter to NTD Patent and Trademark Agency; dated Aug. 29, 2012; Chinese Pat. App. No. 200980129766.7; including U.S. Amendments filed Jan. 13, 1012 and May 9, 2012; 20 pages.
Office Action dated May 12, 2011; for U.S. Appl. No. 12/183,367; 17 pages.
Office Action dated Oct. 20, 2011; for U.S. Appl. No. 12/183,367; 9 pages.
Office Action/Restriction Requirement dated Apr. 12, 2012; for U.S. Appl. No. 12/183,367; 6 pages.
PCT Invitation to Pay Additional Fees with Partial Search Report; dated Oct. 2, 2003 for PCT Pat. App. No. PCT/US03/024489, 3 pages.
PCT Search Report and Written Opinion of the ISA for PCT/US2009/048237 dated Aug. 25, 2009; 10 pages.
PCT Search Report dated Nov. 19, 2003 for PCT Pat. App. No. PCT/US03/02489; 5 pages.
Response to Chinese Action dated May 3, 2012; for Chinese Pat. App. No. 200980129766.7; 10 pages.
Response to Office Action filed Aug. 10, 2011; for U.S. Appl. No. 12/183,367; 13 pages.
Response to Office Action filed Jan. 17, 2012; for U.S. Appl. No. 12/183,367; 15 pages.
Response to Restriction Requirement filed May 9, 2012; for U.S. Appl. No. 12/183,367; 2 pages.

(56) References Cited

OTHER PUBLICATIONS

Robert Bosch GMBH Stuttgart; "Active Sensor for ABS/ASR/VDC-Systems with 2-Wire-Current Interface;" Specification TLE4941/TLE4942; Version 5; Jun. 25, 2000; 44 pages.
Notification of Transmittal of the International Search Report and the Written Opinion of the International Searching Authority, or the Declaration, PCT/US2013/037065, date of mailing Jul. 17, 2013, 4 pages.
Written Opinion of the International Searching Authority, PCT/US2013/037065, date of mailing Jul. 17, 2013, 9 pages.
Park et al.: "Batch-Fabricated Microinductors with Electroplated Magneticaliy Anisotropic and Laminated Alloy Cores", IEEE Transactions on Magnetics, vol. 35, No. 5, Sep. 1999, 10 pages.
Notification Concerning Transmittal of International Preliminary Report on Patentability (Chapter 1 of the Patent Cooperation Treaty), PCT/US2013/037065, date of mailing Nov. 20, 2014, 2 pages.
Written Opinion of the International Searching Authority, PCT/US2013/037065, date of mailing Nov. 20, 2014, 9 pages.
Final Office Action dated Jun. 9, 2015; for U.S. Appl. No. 13/946,400; 17 pages.
Response filed on Jun. 19, 2015 to Office dated Mar. 20, 2015; for U.S. Appl. No. 13/946,417; 15 pages.
Office Action dated Jul. 8, 2015; for U.S. Appl. No. 13/837,982; 25 pages.
U.S. Appl. No. 13/837,982, filed Mar. 15, 2013, Milano et al.
PCT/US2014/018209 PCT Invitation to Pay Additional Fees dated Jul. 7, 2014 7 pages.
Notification of transmittal of the International Search Report and the Written Opinion of the International Searching Authority, or the Declaration, PCT/US2014/018209 date of mailing Sep. 5, 2014, 10 pages.
Written Opinion of the International Searching Authority, PCT/US2014/018209 date of mailing Sep. 5, 2014, 12 pages.
U.S. Appl. No. 13/837,982, Office Action dated Nov. 13, 2014, 34 pages.
U.S. Appl. No. 13/837,982, Amendment filed Apr. 13, 2015, 11 pages.
Response filed Apr. 3, 2015; to Office Action dated Jan. 5, 2015; for U.S. Appl. No. 13/946,400; 13 pages.
Office Action dated Mar. 20, 2015; for U.S. Appl. No. 13/946,417; 54 pages.
European Response to Written Opinion filed on May 28, 2015; for European Pat. App. No. 13722619.7, 15 pages.
Request for Continued Examination dated Dec. 7, 2015; For U.S. Appl. No. 13/837,982; 1 page.
Response dated Dec. 7, 2015 to Final Office Action dated Jul. 8, 2015; For U.S. Appl. No. 13/837,982; 12 pages.
Response dated Mar. 3, 2016 to Office Action dated Dec. 3, 2015; For U.S. Appl. No. 13/946,417; 17 pages.
Final Office Action dated Aug. 28, 2015; for U.S. Appl. No. 13/946,417; 34 pages.
Response dated Nov. 9, 2015 to Final Office Action dated Aug. 28, 2015; For U.S. Appl. No. 13/946,417; 14 pages.
Request for Continued Examination dated Nov. 9, 2015; For U.S. Appl. No. 13/946,417: 3 pages.
Amendment and RCE dated Sep. 9, 2015; for U.S. Appl. No. 13/946,400; 12 pages.
Non-Final Office Action dated Nov. 19, 2015; for U.S. Appl. No. 13/946,400; 24 pages.
Non-Final Office Action dated Dec. 3, 2015; for U.S. Appl. No. 13/946,417; 29 pages.
European Communication under Rule 71(3) EPC, Intention to Grant dated Jun. 2, 2016 corresponding to European Application No. 13722619.7; 7 Pages.
U.S. Appl. No. 13/837,982 Office Action dated Jul. 15, 2016, 33 pages.
European Response filed on Aug. 24, 2016 to the official communication dated Feb. 23, 2016; for European Pat. App. No. 14742423.8; 17 pages.
Office Action dated Oct. 20, 2016; for U.S. Appl. No. 13/946,400; 34 pages.
Final Office Action dated Oct. 6, 2016; for U.S. Appl. No. 13/946,417; 45 pages.
Response filed Oct. 14, 2016 to the Office Action dated Jul. 15, 2016; for U.S. Appl. No. 13/837,982; 15 pages.
Final Office Action dated Oct. 20, 2016 for U.S. Appl. No. 13/946,400; 20 pages.
Voluntary Amendment with English Claims dated Nov. 7, 2016 for Korean App. No. 10-2016-7004178; 15 Pages.
Decision to Grant dated Oct. 27, 2016; for European Pat. App. No. 13722619.7; 2 pages.
Voluntary Amendment dated Nov. 2, 2016 with English claims for Chinese Application No. 201480040243.6; 13 pages.
European Extended Search Report dated Dec. 22, 2016; for European Pat. App. No. 16193227.2; 11 pages.
Japanese Voluntary Amendment with English Claims dated Dec. 12, 2016; for Japanese Pat. App. No. 2016-528006; 7 pages.
Response to Oct. 6, 2016 Final Office Action from U.S. Appl. No. 13/946,417 as filed on Jan. 24, 2017; 14 Pages.
Response filed on Jan. 19, 2017 to Final Office Action dated Oct. 20, 2016; for U.S. Appl. No. 13/946,400;; 13 Pages.
U.S. Final Office Action dated Jan. 26, 2017 for U.S. Appl. No. 13/837,982; 40 Pages.
Office Action dated Mar. 15, 2017 from U.S. Appl. No. 13/946,417; 43 Pages.
U.S. Non-Final Office Action dated Apr. 6, 2017 for U.S. Appl. No. 13/946,400; 36 Pages.
Response (with Amended Claims in English) to Japanese Office Action dated Feb. 13, 2017 for Japanese Application No. 2015-511491; Response filed on Apr. 11, 2017; 9 Pages.
Response (with RCE) to U.S. Final Office Action dated Jan. 26, 2017 for U.S. Appl. No. 13/837,982; Response filed on Apr. 26, 2017; 16 Pages.
Applicant-Initiated Interview Summary dated Mar. 10, 2017 for U.S. Appl. No. 13/946,400; 2 pages.
Japanese Office Action (with English Translation) dated Jan. 13, 2017 for Japanese Application No. 2015-511491; 11 Pages.
U.S. Advisory Action dated Feb. 16, 2017 for U.S. Appl. No. 13/946,400; 4 Pages.
Response to U.S. Final Office Action dated Oct. 20, 2016 (w/RCE) for U.S. Appl. No. 13/946,400; Response filed on Feb. 23, 2017; 17 Pages.
International Search Report and Written Opinion dated Oct. 28, 2014 for Int'l PCT Application PCT/US2014/044991; 12 pages.
International Search Report and Written Opinion dated Nov. 3, 2014 for Int'l PCT Application PCT/US2014/044993; 13 pages.
Daughton J: "Spin-dependent sensors", Proceedings of the IEEE New York, US, vol. 91. No. 5 May 1, 2003; 6 pages.
International Preliminary Report on Patentability dated Jan. 19, 2016 for Int'l PCT Application PCT/US2014/044991; 8 pages.
Response to Office Action dated Jun. 30, 2017 for U.S. Appl. No. 13/946,400; 12 pages.
U.S. Non-Final Office Action dated Aug. 4, 2017 for U.S. Appl. No. 13/837,982; 45 Pages.
PCT International Search Report and Written Opinion dated Jul. 20, 2017 for PCT/US2017/033526; 17 pages.
Japanese Office Action with English translation dated May 18, 2017 for Japanese Application No. 2015-511491, 5 pages.
U.S. Final Office Action dated Sep. 8, 2017 for U.S. Appl. No. 13/946,417; 56 pages.
Japanese Notice of Appeal and Appeal Brief (with English Claims) filed on Sep. 19, 2017 to the Office Action dated May 18, 2017; for Japanese Pat. App. No. 2015-511491; 12 pages.

\* cited by examiner

METHODS AND APPARATUS FOR MAGNETIC SENSOR HAVING INTEGRATED COIL

BACKGROUND OF THE INVENTION

As is known, there are a variety of types of magnetic field sensing elements, including, but not limited to, Hall effect elements, magnetoresistance elements, and magnetotransistors. As is also known, there are different types of Hall effect elements, for example, planar Hall elements, vertical Hall elements, and circular vertical Hall (CVH) elements. As is also known, there are different types of magnetoresistance elements, for example, anisotropic magnetoresistance (AMR) elements, giant magnetoresistance (GMR) elements, tunneling magnetoresistance (TMR) elements, Indium antimonide (InSb) elements, and magnetic tunnel junction (MTJ) elements.

Hall effect elements generate an output voltage proportional to a magnetic field. In contrast, magnetoresistance elements change resistance in proportion to a magnetic field. In a circuit, an electrical current can be directed through the magnetoresistance element, thereby generating a voltage output signal proportional to the magnetic field.

Magnetic field sensors, which use magnetic field sensing elements, are used in a variety of devices including current sensors that sense a magnetic field generated by a current carried by a current-carrying conductor, magnetic switches (also referred to herein as a proximity detector) that sense the proximity of a ferromagnetic or magnetic object, rotation detectors that sense passing ferromagnetic articles, for example, gear teeth, and magnetic field sensors that sense magnetic field or magnetic flux densities of a magnetic field.

SUMMARY OF THE INVENTION

Exemplary embodiments of the present invention provide methods and apparatus for magnetic sensor having an integrated coil and sensing element to detect changes in a magnetic field generated by the excited coil due to the movement of a target, such as a ferrous gear tooth. In one embodiment, the sensing element comprises a giant magnetoresistance (GMR) element, which has more sensitivity to magnetic field changes than a comparable Hall element.

In one aspect of the invention, a magnetic field sensor comprises a die, a coil proximate the die to generate a magnetic field, and a magnetic field sensing element on the die to detect changes in the magnetic field generated by the coil as a result of the presence of a ferromagnetic target.

The sensor can further include one or more of the following features: the coil is integrated in or on the die, the coil is substantially flat, only a portion of the magnetic field sensing element overlaps with the coil, the magnetic field sensing element is positioned at least in part between the coil and the die, the coil is positioned at least in part between the magnetic field sensing element and the die, the magnetic field sensing element comprises a giant magnetoresistance element, about half of an area of the magnetic field sensing element overlaps with the coil, about half of a length of the magnetic field sensing element overlaps with the coil, the magnetic field sensing element comprises a Hall element and a further magnetic field sensing element comprises a giant magnetoresistance element, the die includes circuitry to process information from the magnetic field sensor, a constant current source coupled to the coil, and/or the magnetic field sensing element has at least a portion that overlaps the coil.

In another aspect of the invention, a magnetic field sensor comprises a die, a first means proximate the die for generating a magnetic field, and a second means for detecting changes in the magnetic field generated by the first means as a result of the presence of a ferromagnetic target.

The sensor can further include the first means being integrated in or on the die, the first means comprising a giant magnetoresistance element, and/or the first means further comprising a Hall element.

In a further aspect of the invention, a method comprises providing a die, providing a coil proximate the die to generate a magnetic field, and providing a magnetic field sensing element to detect changes in the magnetic field generated by the coil as a result of the presence of a ferromagnetic target.

The method can further include one or more of the following features: the coil is integrated in or on the die, the magnetic field sensing element is positioned at least in part between the coil and the die, the coil is positioned at least in part between the magnetic field sensing element and the die, and/or the magnetic field sensing element comprises a giant magnetoresistance element and a Hall element.

BRIEF DESCRIPTION OF THE DRAWINGS

The foregoing features of the invention, as well as the invention itself may be more fully understood from the following detailed description of the drawings, in which.

DETAILED DESCRIPTION OF THE INVENTION

Before describing the present invention, some information is provided. As used herein, the term "magnetic field sensing element" is used to describe a variety of types of electronic elements that can sense a magnetic field. The magnetic field sensing elements can be, but are not limited to, Hall effect elements, magnetoresistance elements, or magnetotransistors. As is known, there are different types of Hall effect elements, for example, planar Hall elements, vertical Hall elements, and circular vertical Hall (CVH) elements. As is also known, there are different types of magnetoresistance elements, for example, anisotropic magnetoresistance (AMR) elements, giant magnetoresistance (GMR) elements, tunneling magnetoresistance (TMR) elements, Indium Antimonide (InSb) elements, and magnetic tunnel junction (MTJ) elements.

Some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, metal based types of magnetoresistance elements, vertical Hall elements, and CVH elements tend to have axes of maximum sensitivity parallel to the substrate and some types of Hall elements and some semiconductor magnetoresistance sensors tend to have axes of sensitivity perpendicular to the plane substrate (i.e., sensitive through the thickness of the die).

As used herein, the term "magnetic field sensor" is used to describe a circuit that includes a magnetic field sensing element. Magnetic field sensors are used in a variety of applications, including, but not limited to, a current sensor that senses a magnetic field generated by a current carried by a current-carrying conductor, a magnetic switch (also referred to herein as a proximity detector) that senses the proximity of a ferromagnetic or magnetic object, a rotation detector that senses passing ferromagnetic articles, for example, gear teeth, and a magnetic field sensor (e.g., a linear magnetic field sensor) that senses a magnetic field density of a magnetic field. As used herein, the term "magnetic field signal" is used to describe any circuit signal that results from a magnetic field experienced by a magnetic field sensing element.

In general, exemplary embodiments of the invention provide a magnetic sensor having a coil integrated with a die containing sensor circuitry and a magnetic sensing element, such as a GMR element. In other embodiments, such as magnetoresistance sensor embodiments, can utilize a substrate, which may be an insulator without other circuitry. The coil and the sensor circuitry cooperate to detect changes in a magnetic field resulting from a moving ferrous target, for example. As the coil is excited by a current, a magnetic field is generated. Disturbances to the magnetic field caused by a passing ferromagnetic object, either a soft or hard ferromagnetic material, can be detected for sensing applications. Exemplary applications include sensing of speed, direction, and position sensing, including but not limited to seat position, or buckle presence position sensor applications.

Figure 1:
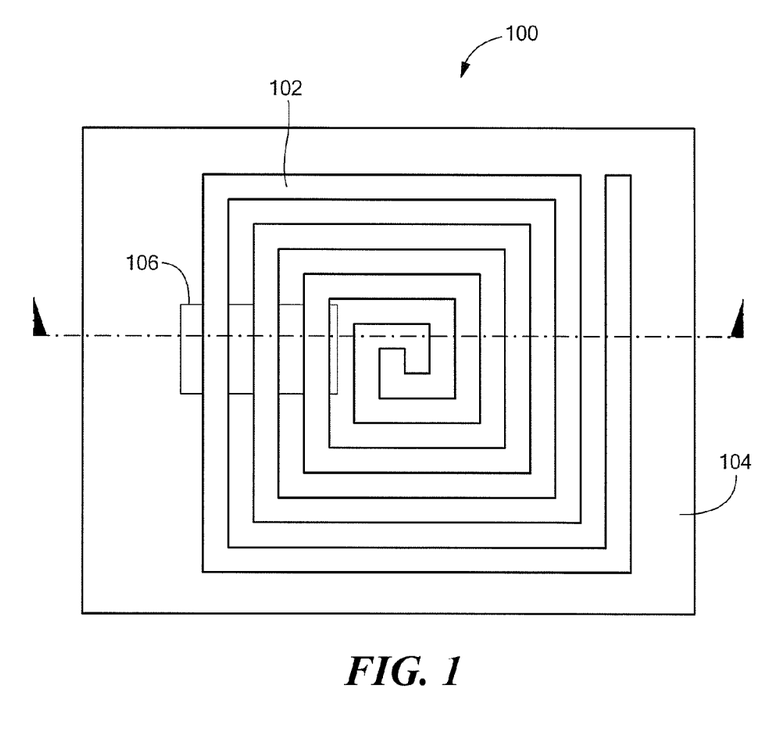
FIG. 1 is a top view of a magnetic sensor having an integrated coil in accordance with exemplary embodiments of the invention.
Figure 1A:
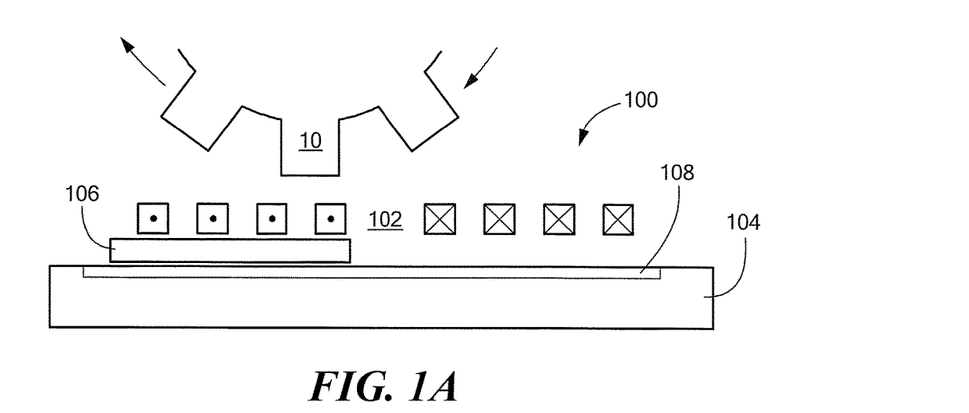
FIG. 1A is a cutaway side view of the sensor of FIG. 1.

FIGS. 1 and 1A show an exemplary magnetic sensor 100 having an integrated coil 102 and a die 104 containing sensor circuitry. A sensor element 106, such as a GMR element, is located proximate the coil 102. A moving target 10, such as a ferrous gear tooth, causes changes in the magnetic field generated by the coil 102 that can be detected by the GMR element 106. Output from the GMR element 106 can be processed by the sensor circuitry in a device layer 108 of the die 104, for example, to provide an output signal for the sensor 100. More particularly, the output of the GMR 106 can be used to determine the relative position of the ferrous target 10 or extraneous magnetic field. The GMR output can be also be used to determine if the ferrous target 10 or extraneous magnetic field is moving past the coils, as well as the speed and direction of the ferrous target or extraneous magnetic field. Circuitry in the device layer to process information from the sensor element is well known in the art.

In the illustrated embodiment of FIGS. 1 and 1A, the position of the sensing element 106 is aligned with one 'side' of the coil 102. That is, the sensing element is aligned with a portion of the coil 102 in which current is flowing the same direction with respect to one side of a rectangular die to the opposite side. In the illustrated embodiment, the current in the coils above the sensing element 106 flows out of (FIG. 1A) the page and current in the coils not above the sensing element flows into the page.

Figure 2:
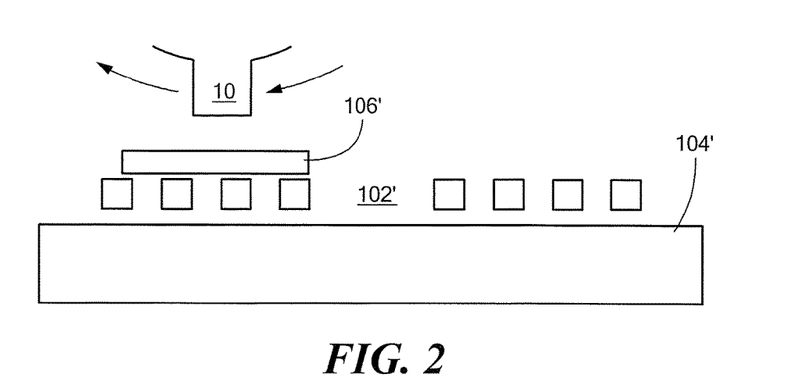
FIG. 2 is cutaway side view of another embodiment of a magnetic sensor in accordance with exemplary embodiments of the invention.

FIG. 2 shows an exemplary magnetic sensor 100' having a coil 102' disposed between the die 104' and the GMR element 106'. With this arrangement, the coils can be fabricated with a standard IC process and then integrated with the GMR in a separate process. In exemplary embodiments, one or more CMP (chemical mechanical polishing) processing steps can occur prior to GMR deposition.

In one embodiment, a GMR sensor element 106' is used. It is understood that, in general, a GMR element is more sensitive to magnetic field changes than a Hall element. Since a GMR element is much more sensitive than a Hall element, the coil size and current required for a given application can be reduced when compared to a Hall implementation. It is understood that a variety of sensing elements can be used to meet the needs of a particular application. Exemplary sensing elements include a Hall element, AMR, GMR, and MTJ elements.

Figure 3:
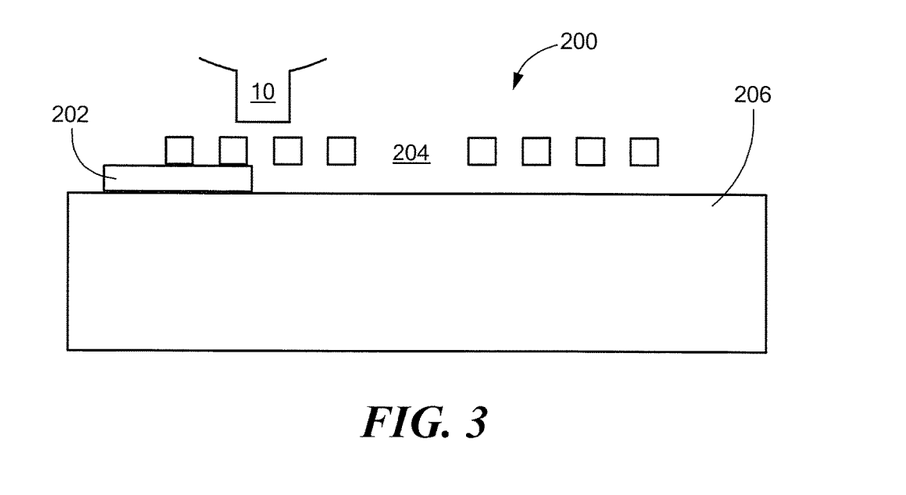
FIG. 3 is a cutaway side view of a further embodiment of a magnetic sensor in accordance with exemplary embodiments of the invention.
Figure 3A:
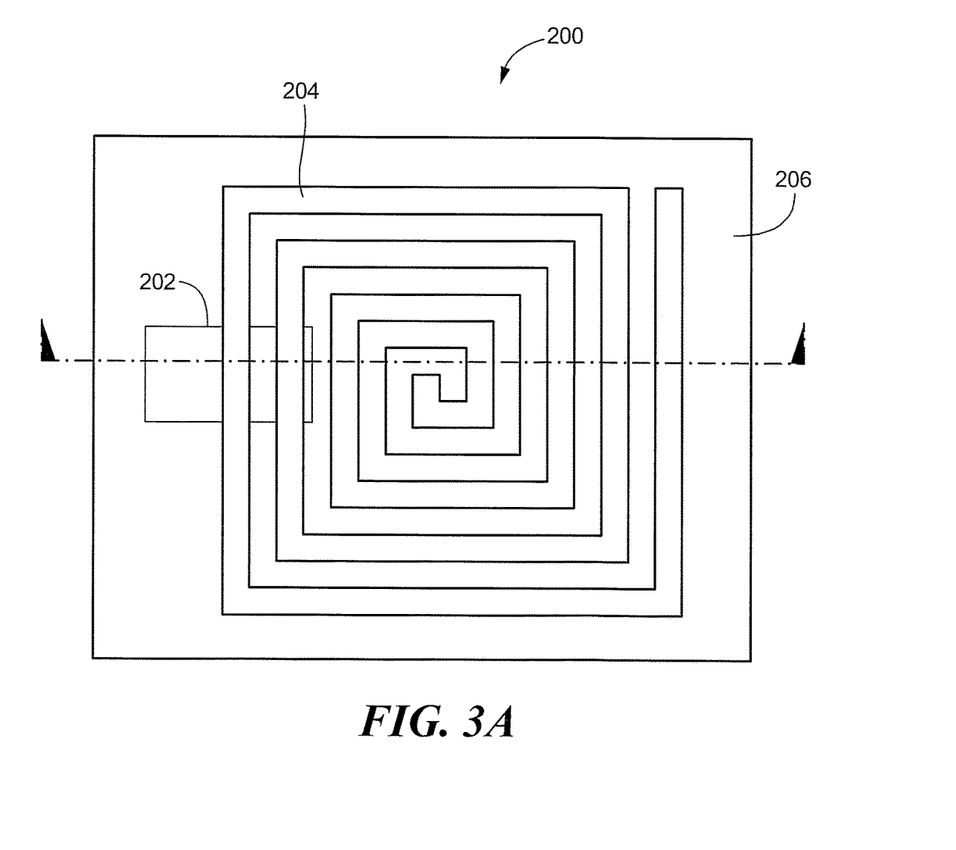
FIG. 3A is a top view of the magnetic sensor of FIG. 3.
Figure 4:
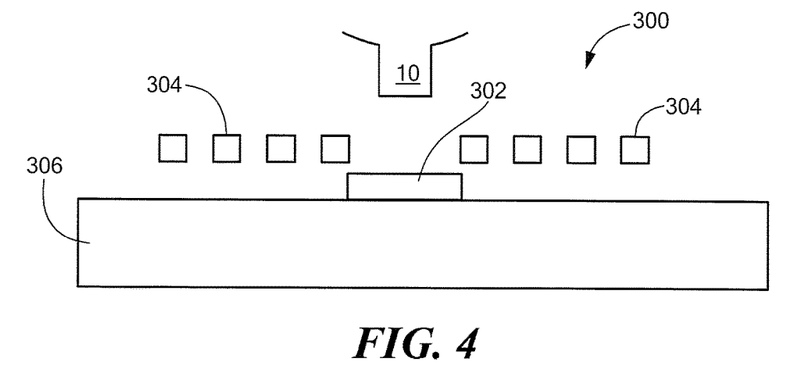
FIG. 4 is a cutaway side view of another embodiment of a magnetic sensor in accordance with exemplary embodiments of the invention.

FIGS. 3 and 3A show an exemplary embodiment of a magnetic sensor 200 having a sensing element 202 between a coil 204 and a die 206, where about half of the magnetic sensing element 202 overlaps with the coil 202 and about half does not overlap. It is understood that insulation layers (not shown for ease of understanding) can be placed between the coil and underlying sensor material and/or substrate as required by sensor and substrate material selection so as not to short circuit the materials and coil. As a ferrous target 10, such as a gear tooth, approaches and/or retreats, rotates, etc., the vector of the magnetic field aligns about perpendicularly to the sensing element 202 and thus, increases the observed magnetic field. This may be true even though the absolute magnetic field value does not change by a large magnitude above the noise of the system if generated in the coil by a constant current source. With this arrangement, the magnetic field of the coil 204 becomes more or less aligned to the axis of sensitivity of the sensing element/magnetic field transducer 202. That is, there is the flux vector and the sensitivity of the transducer element. If perpendicular to the axis of sensitivity, in theory, a field cannot be detected—even if it is very large. Thus, proper positioning allows the transducer to take advantage and exaggerate the measured field by using the fact the magnetic field vector is moving and the sensitivity can increase or decrease even if the absolute value of the field is relatively constant FIG. 4 shows another embodiment of a magnetic sensor 300 having a sensing element 302, coil 304, and a die 306, where the sensing element 302 is generally centered in the coil 304. Changes in the magnetic field reflect the change in reluctance of the flux path near the coil 304 as the target tooth 10 approaches and retreats in relation to the coil.

Figure 5:
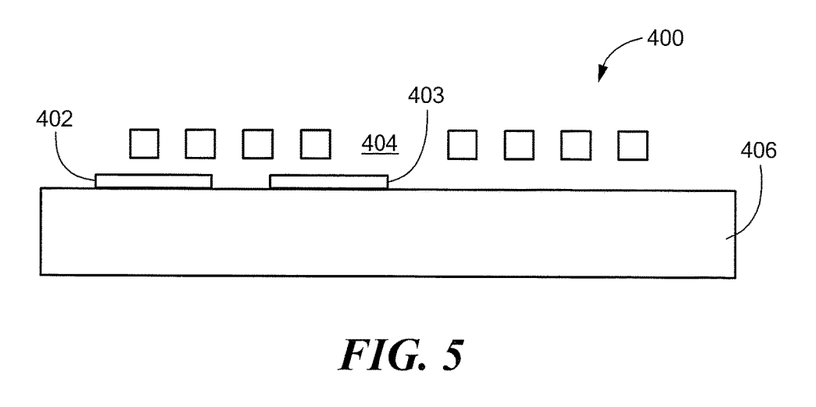
FIG. 5 is a cutaway side view of a further embodiment of a magnetic sensor in accordance with exemplary embodiments of the invention.

FIG. 5 shows an exemplary embodiment of a magnetic sensor 400 having first and second sensing elements 402, 403, proximate a coil 404 and a die 406. In one embodiment, the first sensing element includes a Hall element 403 and the second sensing element includes a GMR element 402. The Hall element 402 is optimized for close air-gap measurements and the GMR element 403 is optimized for far air-gap measurements. With this arrangement, outputs from the Hall element 402 and the GMR element 403 can be processed together or independently.

Figure 5A:
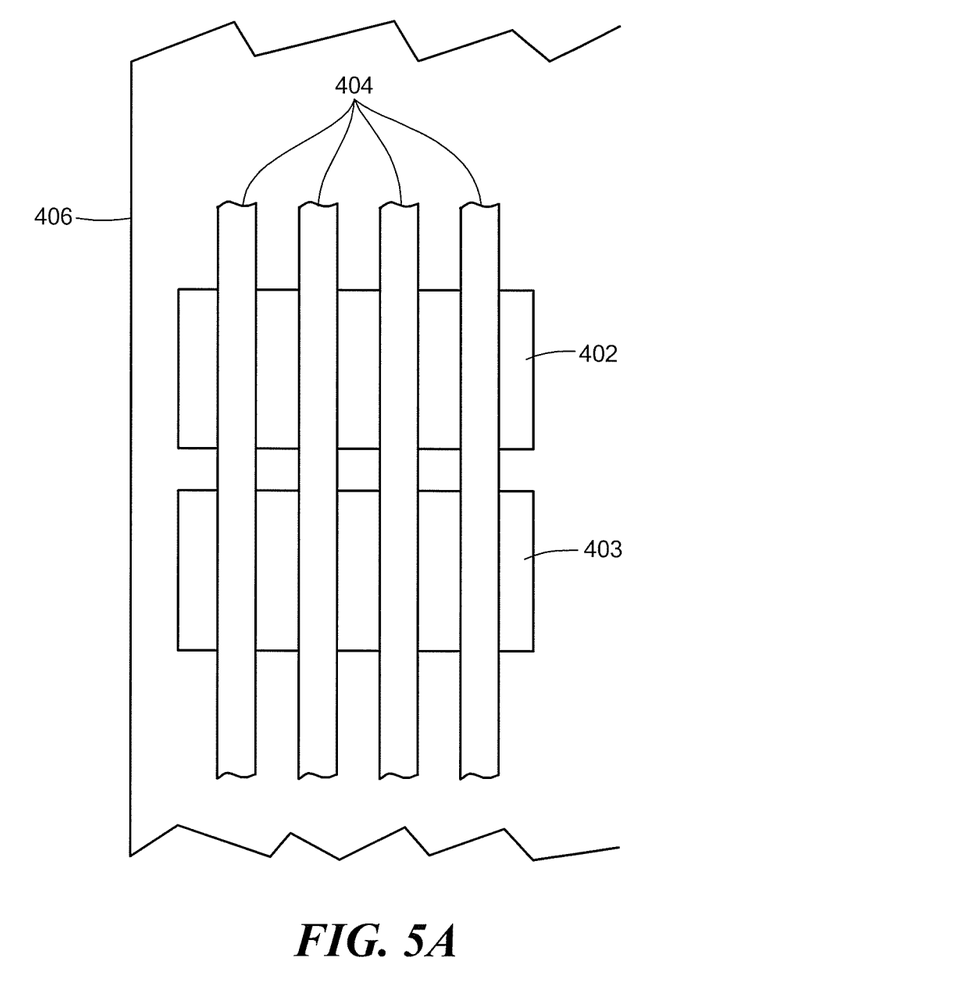
FIG. 5A is a cutaway side view of a still further embodiment of a magnetic sensor in accordance with exemplary embodiments of the invention.

FIG. 5A shows an exemplary embodiment in which the first and second sensing elements 402, 403 are located in 'series' aligned with the coil along a path of the current flowing through the coil.

In one embodiment, the coil(s) can be selectively energized with a current to achieve a desired magnetic field. For example, the coil may be energized for the time when a target may be in proximity to the sensor.

It is understood that the particular size and geometry of the components, coils etc., can vary to meet the needs of a particular application. In exemplary embodiments, coils may range from 10 um spaces and traces to ID (inner diameter) of 50 um to approximately 200 um and OD (outer diameter) from about 60 um (for one turn) to about 500 um. Larger ODs are possible to 750 um, for example, depending on the application. It is further understood that the coil can be generally square, circular, ovular, etc.

In general, spacing from the coil to the sensing element can vary, in part as a result of voltage isolation requirements. An exemplary spacing ranges from about 0.1 um to about 10.0 um, and more typically, between 0.3 and 3.0 um. Coil currents may range from about 1 to about 100 mA, for example, but more typically from about 5 to about 50 mA. For example, if the coil current is modulated, larger bursts or pulses of coil current can be used to determine if the target/ferrous object to be sensed is in a far air-gap condition, e.g., more than about 3 mm. A magnetic field is typically sensed at about 0.5 mm to about 3 mm airgap.

By adjusting the current in the coil based on the target location, the device uses less power. Less power is used for closer airgaps and more power for farther airgaps. Coil current can be pulsed or adjusted based on the signal received from the magnetic field sensor to use less power over time.

In exemplary embodiments, the coil is formed using conventional deposition and or etching processes well known to one of ordinary skill in the art. It is understood that the coil can have any practical shape, as seen in a top view, such as square, rectangular, circular, ovular, etc. It is also understood that insulation layers may be placed between the coils and the sensors and/or substrate to prevent shorting of the coil to other electrical layers in the system.

The coils shown in the figures generally are shown with a planar spiral type of geometry and of a single layer. It is understood that multiple metal layers of the coils can be used as well as other geometries of metal, for example solenoid type coils. It is further understood that alternative embodiments can include a flux concentrator, which can comprise a soft magnetic material, to improve the magnetic flux generated by the coil.

It is understood that exemplary embodiments of a magnetic sensor having an integrate coil are applicable to a wide variety of applications. For example, in one embodiment, a magnetic sensor with an integrated coil is optimized for seat belt detection. In another embodiment, a magnetic sensor is optimized for seat position detection with air gaps in the order of about 0.5 to about 3 mm.

Having described preferred embodiments, which serve to illustrate various concepts, structures and techniques, which are the subject of this patent, it will now become apparent to those of ordinary skill in the art that other embodiments incorporating these concepts, structures and techniques may be used. Accordingly, it is submitted that that scope of the patent should not be limited to the described embodiments but rather should be limited only by the spirit and scope of the following claims. All references cited herein are hereby incorporated herein by reference in their entirety.

What is claimed is:

1. A magnetic field sensor, comprising:
   a die;
   a coil proximate the die to generate a magnetic field;
   a Hall element magnetic field sensing element on said die to detect changes in the magnetic field generated by the coil as a result of movement of a ferromagnetic target external to the magnetic field sensor;
   a constant current source coupled to the coil such that alignment changes of the magnetic field generated by the coil with respect to the magnetic sensing element caused by movement of the target are detected by the magnetic field sensing element,
   wherein the movement of the ferromagnetic target to a first position causes a vector of the magnetic field generated by the coil to align substantially perpendicularly to the magnetic field sensing element which increases the magnetic field observed by the magnetic field sensing element, and further movement of the ferromagnetic target to a second position changes the magnetic field observed by the magnetic field sensing element; and
   a GMR magnetic sensing element positioned in relation to the coil, wherein the Hall element magnetic sensing element is configured for a first airgap distance, and the GMR magnetic sensing element is configured for a second airgap distance, which is greater than the first airgap distance.

2. The sensor according to claim 1, wherein the coil is integrated with the die.

3. The sensor according to claim 1, wherein the coil is substantially flat.

4. The sensor according to claim 1, wherein the coil comprises a solenoid.

5. The sensor according to claim 1, wherein the only a portion of the Hall magnetic field sensing element overlaps with the coil.

6. The sensor according to claim 1, wherein the Hall magnetic field sensing element is positioned at least in part between the coil and the die.

7. The sensor according to claim 1, wherein the coil is positioned at least in part between the Hall magnetic field sensing element and the die.

8. The sensor according to claim 1, wherein about half of an area of the Hall magnetic field sensing element overlaps with the coil.

9. The sensor according to claim 1, wherein about half of a length of the Hall magnetic field sensing element overlaps with the coil.

10. The sensor according to claim 1, wherein sensor includes a further magnetic field sensing element.

11. The sensor according to claim 1, wherein the die includes circuitry to process information from the Hall magnetic field sensor.

12. The sensor according to claim 1, wherein the Hall magnetic field sensing element has at least a portion that overlaps the coil.

13. The sensor according to claim 1, wherein the GMR magnetic field sensing element comprises a semiconductor device.

14. A magnetic field sensor, comprising:
   a die;
   a first means proximate the die for generating a magnetic field, wherein the first means comprises a coil; and
   a second means for detecting changes in the magnetic field generated by the first means as a result of movement of a ferromagnetic target external to the magnetic field sensor, wherein the second means comprises a Hall element magnetic sensing element;
   a constant current source means coupled to the first means such that alignment changes of the magnetic field generated by the coil with respect to the Hall magnetic sensing element caused by movement of the target are detected by the Hall magnetic field sensing element, wherein the movement of the ferromagnetic target to a first position causes a vector of the magnetic field generated by the coil to align substantially perpendicularly to the Hall magnetic field sensing element, which increases the magnetic field observed by the Hall magnetic field sensing element, and further movement of the ferromagnetic target to a second position changes the magnetic field observed by the Hall magnetic field sensing element, and and a GMR magnetic sensing element positioned in relation to the coil, wherein the Hall element magnetic sensing element is configured for a first airgap distance, and the GMR magnetic sensing element is configured for a second airgap distance, which is greater than the first airgap distance.

15. The sensor according to claim 14, wherein the first means is integrated with the die.

16. A method, comprising:

providing a die within a magnetic field sensor;

providing a coil proximate the die to generate a magnetic field;

providing a Hall element magnetic field sensing element to detect changes in the magnetic field generated by the coil as a result of movement of a ferromagnetic target external to the magnetic field sensor;

coupling a constant current source to the coil such that alignment changes of the magnetic field generated by the coil with respect to the magnetic sensing element caused by movement of the target are detected by the magnetic field sensing element, wherein the movement of the ferromagnetic target to a first position causes a vector of the magnetic field generated by the coil to align substantially perpendicularly to the magnetic field sensing element, which increases the magnetic field observed by the magnetic field sensing element, and further movement of the ferromagnetic target to a second position changes the magnetic field observed by the magnetic field sensing element; and providing a GMR magnetic sensing element positioned in relation to the coil, wherein the Hall element magnetic sensing element is configured for a first airgap distance, and the GMR magnetic sensing element is configured for a second airgap distance, which is greater than the first airgap distance.

17. The method according to claim 16, wherein the coil is integrated on the die.

18. The method according to claim 16, wherein the GMR magnetic field sensing element is positioned at least in part between the coil and the die.

19. The method according to claim 16, wherein the coil is positioned at least in part between the GMR magnetic field sensing element and the die.

20. The method according to claim 16, wherein the GMR magnetic field sensing element has at least a portion that overlaps the coil.

21. A magnetic field sensor, comprising:

a die;

a coil proximate the die to generate a magnetic field, wherein the coil is integrated with the die;

a GMR magnetic field sensing element on said die to detect changes in the magnetic field generated by the coil as a result of movement of a ferromagnetic target external to the magnetic field sensor, wherein the die includes circuitry to process information from the magnetic field sensing element;

a constant current source coupled to the coil such that alignment changes of the magnetic field generated by the coil with respect to the magnetic sensing element caused by movement of the target are detected by the magnetic field sensing element, wherein the movement of the ferromagnetic target causes a vector of the magnetic field generated by the coil to align substantially parallel to the magnetic field sensing element; and a Hall magnetic sensing element positioned in relation to the coil, wherein the Hall element magnetic sensing element is configured for a first airgap distance, and the GMR magnetic sensing element is configured for a second airgap distance, which is greater than the first airgap distance.

22. The sensor according to claim 21, wherein the only a portion of the GMR magnetic field sensing element overlaps with the coil.

23. The sensor according to claim 21, wherein the GMR magnetic field sensing element is positioned at least in part between the coil and the die.

24. The sensor according to claim 21, wherein the coil is positioned at least in part between the GMR magnetic field sensing element and the die.

25. A magnetic field sensor, comprising:

a die;

a coil proximate the die to generate a magnetic field;

a GMR magnetic field sensing element on said die to detect changes in the magnetic field generated by the coil as a result of movement of a ferromagnetic target external to the magnetic field sensor;

a constant current source coupled to the coil such that alignment changes of the magnetic field generated by the coil with respect to the GMR magnetic sensing element caused by movement of the target are detected by the GMR magnetic field sensing element, wherein the movement of the ferromagnetic target to a first position causes a vector of the magnetic field generated by the coil to align substantially perpendicularly to the GMR magnetic field sensing element which increases the magnetic field observed by the GMR magnetic field sensing element, and further movement of the ferromagnetic target to a second position changes the magnetic field observed by the GMR magnetic field sensing element; and a Hall magnetic sensing element positioned in relation to the coil, wherein the Hall element magnetic sensing element is configured for a first airgap distance, and the GMR magnetic sensing element is configured for a second airgap distance, which is greater than the first airgap distance.

* * * * *

UNITED STATES PATENT AND TRADEMARK OFFICE
CERTIFICATE OF CORRECTION

PATENT NO. : 9,817,078 B2  
APPLICATION NO. : 13/468478  
DATED : November 14, 2017  
INVENTOR(S) : Gary T. Pepka et al.

Page 1 of 1

It is certified that error appears in the above-identified patent and that said Letters Patent is hereby corrected as shown below:

In the Specification

Column 3, Line 56, delete "can be also be used" and replace with --can also be used--

Column 4, Line 24, delete "coil 202" and replace with --coil 204--

Column 4, Line 57, delete "Hall element 403" and replace with --Hall element 402--

Column 4, Line 58, delete "GMR element 402" and replace with --GMR element 403--

In the Claims

Column 7, Lines 12-13, delete "and and a GMR" and replace with --and a GMR--

Column 8, Line 25, delete "wherein the only" and replace with --wherein only--

Signed and Sealed this  
Seventh Day of May, 2019

Andrei Iancu  
*Director of the United States Patent and Trademark Office*